(12) United States Patent
Lee

(10) Patent No.: US 10,436,412 B2
(45) Date of Patent: Oct. 8, 2019

(54) LAMP ASSEMBLY FOR VEHICLE

(71) Applicant: LG ELECTRONICS INC., Seoul (KR)

(72) Inventor: Jonghak Lee, Seoul (KR)

(73) Assignee: LG Electronics Inc., Seoul (KR)

(*) Notice: Subject to any disclaimer, the term of this patent is extended or adjusted under 35 U.S.C. 154(b) by 134 days.

(21) Appl. No.: 15/639,350

(22) Filed: Jun. 30, 2017

(65) Prior Publication Data
US 2018/0031203 A1  Feb. 1, 2018

(30) Foreign Application Priority Data

Jul. 29, 2016 (KR) .................. 10-2016-0097569

(51) Int. Cl.
*F21S 43/145* (2018.01)
*F21S 43/37* (2018.01)
(Continued)

(52) U.S. Cl.
CPC .......... *F21S 43/145* (2018.01); *B60Q 1/0094* (2013.01); *B60Q 1/2661* (2013.01);
(Continued)

(58) Field of Classification Search
CPC ......... F21Y 2115/15; F21Y 2115/2105; B60Q 1/2661; B60Q 1/34; B60Q 1/44; B60Q 1/0094; B60Q 1/0483; F21S 43/145; F21S 43/00; F21S 43/19; F21S 43/195; F21S 45/00; F21S 45/33; H01L 2251/5361; H01L 51/5237; H01R 12/78
See application file for complete search history.

(56) References Cited

U.S. PATENT DOCUMENTS 8,674,595 B2  3/2014 Natsume
9,074,744 B2  7/2015 Tsukamoto
(Continued)

FOREIGN PATENT DOCUMENTS

CN  202747199      2/2013
DE  102004007355 A1  9/2005
(Continued)

OTHER PUBLICATIONS

Partial European Search Report in European Application No. 17001288. 4, dated Dec. 22, 2017, 14 pages (with English translation).
(Continued)

*Primary Examiner* — Peggy A Neils
(74) *Attorney, Agent, or Firm* — Fish & Richardson P.C.

(57) ABSTRACT

A lamp assembly for a vehicle includes a housing that defines a space; an outer lens that covers the space defined by the housing; and a bezel disposed on the space defined by the housing. The lamp assembly also includes a plurality of OLED modules mounted on the bezel that is disposed on the space defined by the housing, the plurality of OLED modules mounted to be separated from each other. The lamp assembly further includes a drive module configured to control the plurality of OLED modules; and a connecting flexible circuit board disposed on at least one of the housing or the bezel, to which each of the plurality of OLED modules is connected and which is connected to the drive module.

18 Claims, 12 Drawing Sheets

(51) Int. Cl.

| | |
|---|---|
| *F21S 45/10* | (2018.01) |
| *F21S 43/19* | (2018.01) |
| *F21S 43/20* | (2018.01) |
| *B60Q 1/26* | (2006.01) |
| *B60Q 1/34* | (2006.01) |
| *B60Q 1/44* | (2006.01) |
| *F21V 23/00* | (2015.01) |
| *F21V 23/06* | (2006.01) |
| *H01L 51/52* | (2006.01) |
| *H01R 12/70* | (2011.01) |
| *H01R 12/78* | (2011.01) |
| *B60Q 1/00* | (2006.01) |
| *F21S 43/14* | (2018.01) |
| *F21S 45/33* | (2018.01) |
| *F21Y 115/15* | (2016.01) |
| *H05K 1/14* | (2006.01) |

(52) U.S. Cl.
CPC ............ *B60Q 1/2696* (2013.01); *B60Q 1/34* (2013.01); *B60Q 1/44* (2013.01); *F21S 43/14* (2018.01); *F21S 43/19* (2018.01); *F21S 43/195* (2018.01); *F21S 43/26* (2018.01); *F21S 43/37* (2018.01); *F21S 45/10* (2018.01); *F21S 45/33* (2018.01); *F21V 23/001* (2013.01); *F21V 23/06* (2013.01); *H01L 51/5237* (2013.01); *H01R 12/7076* (2013.01); *H01R 12/78* (2013.01); *F21Y 2115/15* (2016.08); *H01L 2251/5361* (2013.01); *H05K 1/147* (2013.01); *H05K 2201/10113* (2013.01)

(56) References Cited

U.S. PATENT DOCUMENTS

| | | | | |
|---|---|---|---|---|
| 9,423,111 | B2 * | 8/2016 | Kotera | .................... F21V 19/04 |
| 9,534,760 | B2 * | 1/2017 | Sander | .................... F21S 45/43 |
| 2005/0105300 | A1 | 5/2005 | Pajer | |
| 2012/0201038 | A1 * | 8/2012 | Birnstock | ............... F21S 6/003 |
| | | | | 362/404 |
| 2015/0167918 | A1 | 6/2015 | Yang | |
| 2016/0215963 | A1 | 7/2016 | Dubose et al. | |
| 2017/0066372 | A1 * | 3/2017 | Ruat | .................. H05B 33/0896 |
| 2018/0009365 | A1 * | 1/2018 | Rubia | .................. B60Q 1/0483 |
| 2018/0017224 | A1 * | 1/2018 | Sirowatka | ............ F21S 41/148 |

FOREIGN PATENT DOCUMENTS

| | | |
|---|---|---|
| DE | 102007041335 | 3/2009 |
| DE | 202013105597 A1 | 5/2014 |
| EP | 1447620 A1 | 8/2004 |
| EP | 2031299 | 3/2009 |
| EP | 3009301 | 4/2016 |
| JP | 2004095526 A1 | 3/2004 |
| JP | 2012160430 | 8/2012 |
| JP | 2014110178 | 6/2014 |
| JP | 2014149986 | 8/2014 |
| JP | 2015220033 | 12/2015 |
| KR | 10-2012-0076197 | 7/2012 |
| KR | 10-2012-0097802 | 9/2012 |
| KR | 10-2013-0021328 | 3/2013 |
| KR | 10-2013-0031116 | 3/2013 |
| KR | 10-2014-0049903 | 4/2014 |
| KR | 10-2014-0079932 | 6/2014 |
| KR | 10-2016-0015759 | 2/2016 |
| KR | 10-2016-0049780 | 5/2016 |
| WO | 2015032949 | 3/2015 |

OTHER PUBLICATIONS

Extended European Search Report in European Application No. 17001288.4, dated Mar. 6, 2018, 17 pages.

Chinese Office Action in Chinese Application No. 201710288117.8, dated Jul. 22, 2019, 9 pages.

* cited by examiner

LAMP ASSEMBLY FOR VEHICLE

CROSS-REFERENCE TO RELATED APPLICATIONS

The present application claims the benefit of an earlier filing date and right of priority under 35 U.S.C. 119 and 35 U.S.C. 365 to Korean Patent Application No. 10-2016-0097569, filed on Jul. 29, 2016, the content of which is hereby incorporated by reference in its entirety.

TECHNICAL FIELD

The present disclosure generally relates to a lamp assembly for a vehicle.

BACKGROUND

Vehicles typically include a lamp assembly that provides improved visibility for a driver or that informs those outside the vehicle of a running state of the vehicle. Such lamp assemblies typically increase an intensity of illumination of the surroundings of the vehicle during a running state of the vehicle.

A lamp assembly installed in a vehicle is often used, for example, in a head lamp which irradiates light in the front direction of the vehicle or in a rear lamp which illuminates the rear of a vehicle when driving at night or stopping, indicates a turn direction of the vehicle, informs other vehicles of whether a brake operation is performed, or the like.

SUMMARY

Implementations described herein enable a lamp assembly for a vehicle that includes a plurality of organic light emitting diodes (OLEDs).

In one aspect, a lamp assembly for a vehicle may include a housing that defines a space; an outer lens that covers the space defined by the housing; and a bezel disposed on the space defined by the housing. The lamp assembly may also include a plurality of OLED modules mounted on the bezel that is disposed on the space defined by the housing, the plurality of OLED modules mounted to be separated from each other. The lamp assembly may further include a drive module configured to control the plurality of OLED modules; and a connecting flexible circuit board disposed on at least one of the housing or the bezel, to which each of the plurality of OLED modules is connected and which is connected to the drive module.

In some implementations, each OLED module of the plurality of OLED modules may include: an OLED to which a module flexible circuit board is connected; and a holder mounted on the bezel and to which the OLED is coupled. The module flexible circuit board may be connected to the connecting flexible circuit board.

In some implementations, the lamp assembly may further include a hook that is configured to hook the holder to the bezel, the hook being formed on at least one of the bezel or the holder.

In some implementations, the lamp assembly may further include a fastening member configured to fasten the holder to the bezel.

In some implementations, the bezel may include a plurality of holder mounting portions configured to mount the holder. The plurality of holder mounting portions may be formed to be spaced apart from each other.

In some implementations, each of the plurality of holder mounting portions may include: a projecting portion that projects towards the outer lens; and a holder pocket into which a portion of the holder is inserted and housed. The holder pocket may be positioned in an inside of the projecting portion by being depressed in a direction that is opposite of the outer lens in the projecting portion.

In some implementations, a through-hole which passes through the module flexible circuit board may be defined on the holder pocket.

In some implementations, the holder pocket may include an expansion portion configured to expand with decreasing distance to the outer lens. The holder may include an inclined portion in which at least a portion of the holder is inserted into the expansion portion and is housed. The inclined portion may be configured to expand with decreasing distance to the outer lens.

In some implementations, each of the plurality of holder mounting portions may have the same mounting angle for mounting the holder in a first direction. At least two of the plurality of holder mounting portions may have different mounting angles for mounting the holder in a second direction different from the first direction.

In some implementations, each OLED module of the plurality of OLED modules may further include a clip bezel coupled to the holder, and the clip bezel may cover a portion of the module flexible circuit board.

In some implementations, the module flexible circuit board may include a concealing portion and an extending portion that extends from the concealing portion. The concealing portion may be concealed by the clip bezel between the clip bezel and the holder in a state in which the clip bezel is coupled to the holder. The extending portion may extend through a holder mounting portion formed on the bezel in a front side of the bezel.

In some implementations, the module flexible circuit board may include a connector that is detachable from the connecting flexible circuit board. The connector may be provided in the extending portion.

In some implementations, the connecting flexible circuit board may include: a plurality of first flexible circuit boards to which a module flexible circuit board is connected and that is disposed on the bezel, the plurality of first flexible circuit boards spaced apart from each other, and at least one second flexible circuit board that interconnects at least two of the plurality of first flexible circuit boards.

In some implementations, the connecting flexible circuit board may be attached to a front surface of the bezel.

In some implementations, the connecting flexible circuit board may include a main connector that is detachable from the drive module.

In some implementations, the plurality of OLED modules may be spaced apart from each other in a vertical direction, and a first OLED module among the plurality of OLED modules may be overlapped with a portion of a second OLED module among the plurality of OLED modules that is positioned at an upper side of the first OLED module.

In some implementations, the plurality of OLED modules may be spaced apart from each other in a horizontal direction, and a first OLED module among the plurality of OLED modules may be overlapped with a portion of a second OLED module among the plurality of OLED modules that is positioned at a lateral side of the first OLED module.

In some implementations, the housing may include a dehumidifying bag housing portion on which a dehumidifying bag housing space is formed, the dehumidifying bag housing portion configured to house a dehumidifying bag.

The dehumidifying bag housing portion may define a first through-hole and a second through-hole, the first through-hole configured to pass air therethrough, and the second through-hole configured to pass a cable therethrough that connects to at least one processor.

In some implementations, each OLED module of the plurality of OLED modules may include: an OLED to which a module flexible circuit board is connected; and a holder which is mounted on the bezel and to which the OLED is coupled. The module flexible circuit board may be connected to the connecting flexible circuit board, and the holder may include a shielding portion that conceals a portion of the module flexible circuit board.

In some implementations, each OLED module of the plurality of OLED modules may further include an adhesive material configured to couple the OLED of the OLED module to the holder. The adhesive material may be arranged between the OLED and the holder.

Further scope of applicability of the present disclosure will become more apparent from the detailed description given hereinafter. However, it should be understood that the detailed description and specific examples are given by way of illustration only, and that various changes and modifications within the spirit and scope of the disclosure may be made.

DETAILED DESCRIPTION

A vehicle may include a lamp having a light emitting diode (LED) or an organic light emitting diode (OLED). Such a lamp may be mounted on a front portion or on a rear portion of a vehicle.

Implementations described herein provide a lamp assembly for a vehicle that includes a plurality of OLEDs. The lamp assembly may be configured to simplify the assembly process thereof and provide a more compact assembly for the plurality of OLEDs.

In some implementations, each of the plurality of OLED modules may be connected to a connecting flexible circuit board, and the connecting flexible circuit board may be connected to the drive module. As such, the structure for connecting the plurality of OLED modules and a drive module may be made simple and compact.

In some scenarios, according to implementations disclosed herein, the lamp assembly structure may be made simpler and more compact by implementing a module flexible circuit board in each of the plurality of OLED modules which connects to the connecting flexible circuit board.

The plurality of OLED modules may be mounted on a bezel. The bezel may be configured with a holder that mounts the plurality of OLED modules at different angles by implementing different angles of the holder.

In some implementations, the holder may be fixed to the bezel in a simpler and more rigid manner, thus mitigating shaking of the OLED modules by vibration of a vehicle or the like, and the OLED module may therefore be more rigidly fixed.

The plurality of OLED modules may be controlled by a drive module, and the drive module may be positioned about the bezel and the bezel may be configured to conceal the drive module. As such, in some implementations, an inside portion which is viewed through the outer lens may appear more concise and the plurality of OLEDs may be positioned on an area with increased width.

In addition, in some implementations, transfer of heat from the plurality of OLEDs to the drive module and to the connecting flexible circuit board may be mitigated by the plurality of OLEDs being positioned on a rear side of the bezel, with the drive module and the connecting flexible circuit board being positioned on a front side of the bezel. As such, there may be an advantage that performance degradations caused by temperature increase of the drive module may be mitigated.

In addition, implementations may provide an advanced design that may reduce damage of the module flexible circuit board by providing increased protection for the module flexible circuit board.

Hereinafter, some examples of specific implementations will be described in detail with reference to the drawings.

Figure 1:
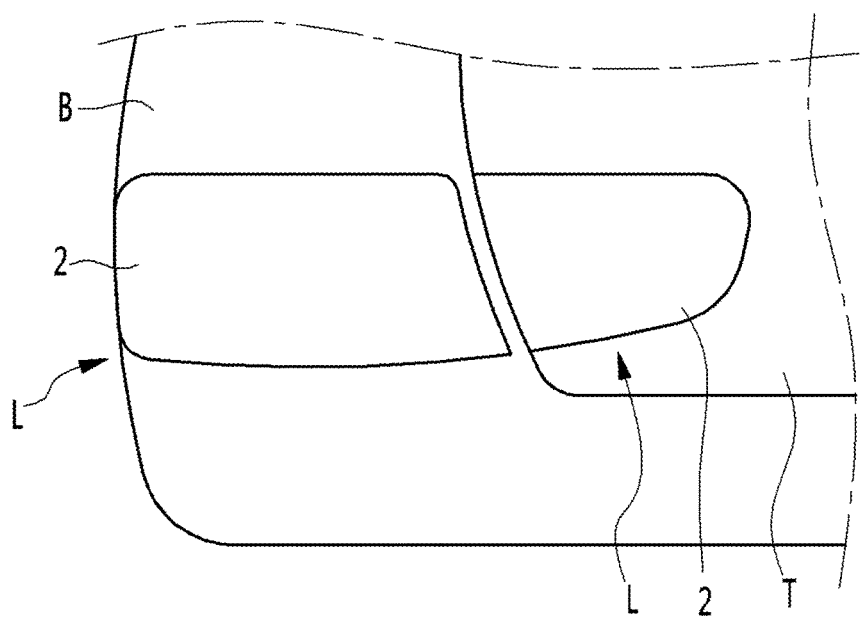
FIG. 1 is a diagram illustrating an example of a rear view of a lamp module for a vehicle according to some implementations.

FIG. 1 is a rear view illustrating a lamp module for a vehicle according to some implementations.

A lamp assembly L for a vehicle according to the present disclosure may be installed to a rear side portion of a body B of the body B of a vehicle of a trunk T of a vehicle.

The lamp assembly L for a vehicle may be used as a tail lamp by being installed to a rear side portion of the body B of a vehicle or as a stop/turn lamp by being installed to the trunk T of a vehicle.

Any one of two lamp assemblies L for a vehicle of which sizes or a shapes are different from each other may be used as a first lamp by being installed to the rear side portion of the body B of a vehicle and the other one thereof may be used as a second lamp by being installed to the trunk T of a vehicle.

The two lamp assemblies L for a vehicle may form illumination patterns which are independent of each other.

The two lamp assemblies L for a vehicle may implement various illumination patterns. The various illumination patterns may form by combination of a illumination pattern formed on any one of the two lamp assemblies L for a vehicle and a illumination pattern formed on the other one of the two lamp assemblies L for a vehicle. The two lamp assemblies L for a vehicle may form various illumination patterns such as an animation illumination in which a shape or a position of the illumination pattern is changed.

Figure 2:
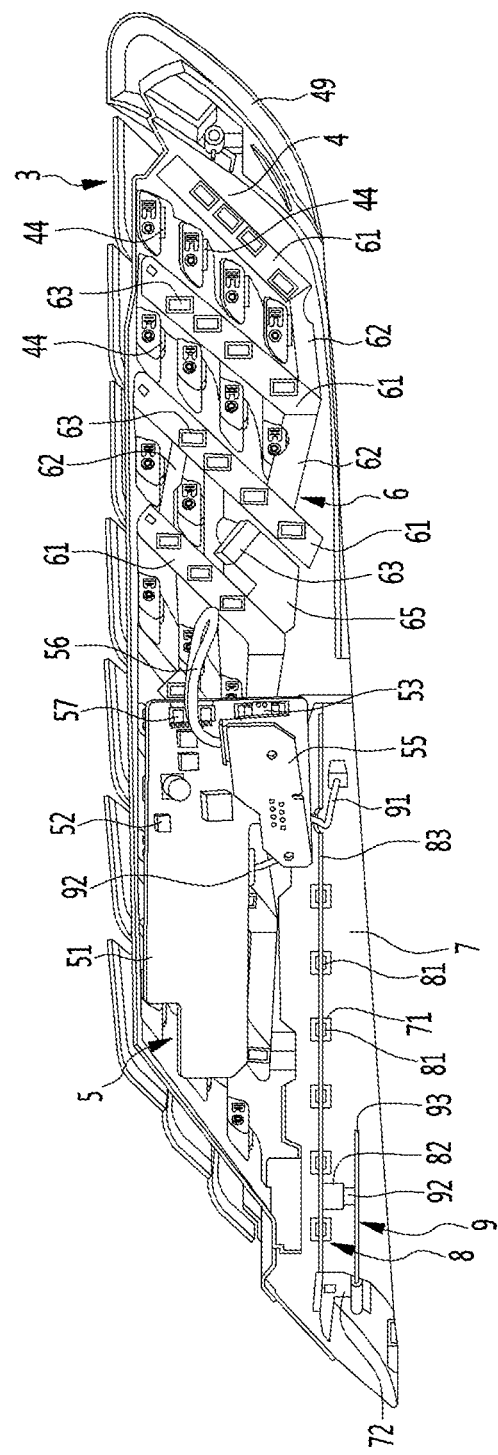
FIG. 2 is a diagram illustrating an example of a front view of an inside of a lamp module for a vehicle according to some implementations.
Figure 3:
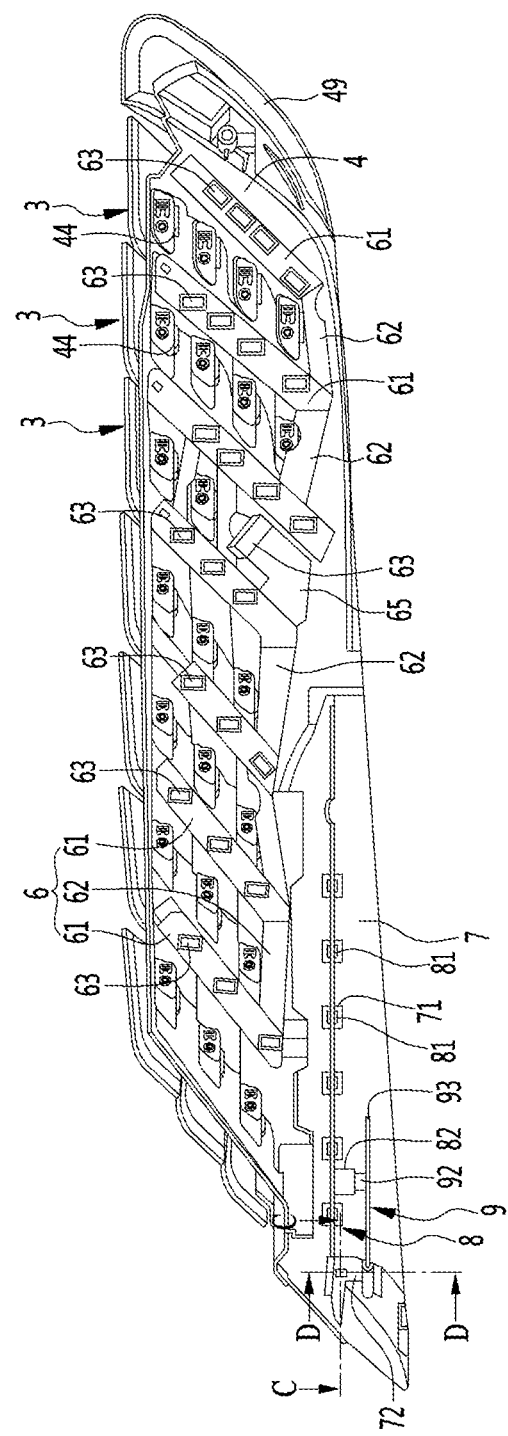
FIG. 3 is a diagram illustrating an example of a front view of a lamp module in a state in which a drive module is separated.
Figure 4:
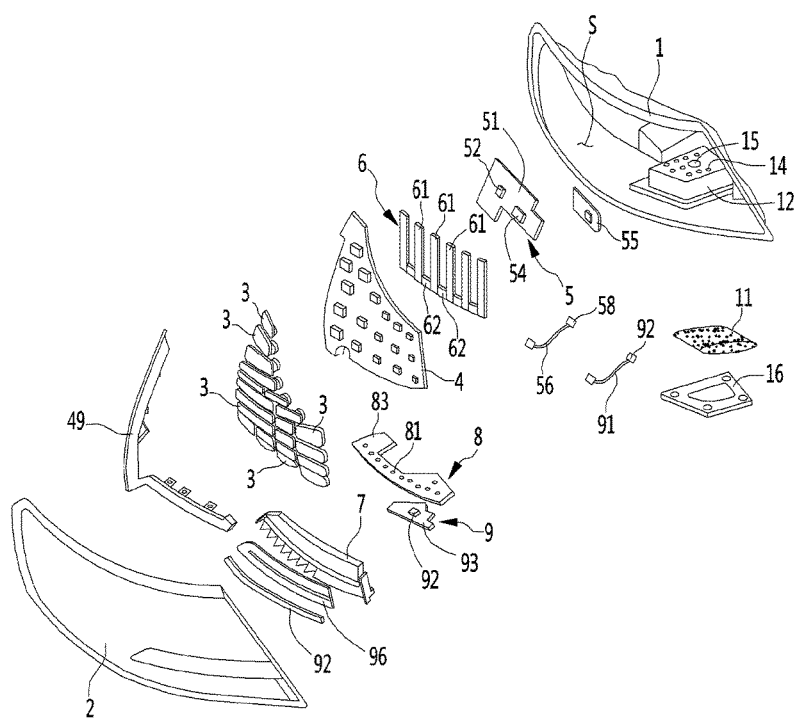
FIG. 4 is a diagram illustrating an example of an exploded perspective view of a lamp module for a vehicle according to some implementations.
Figure 5:
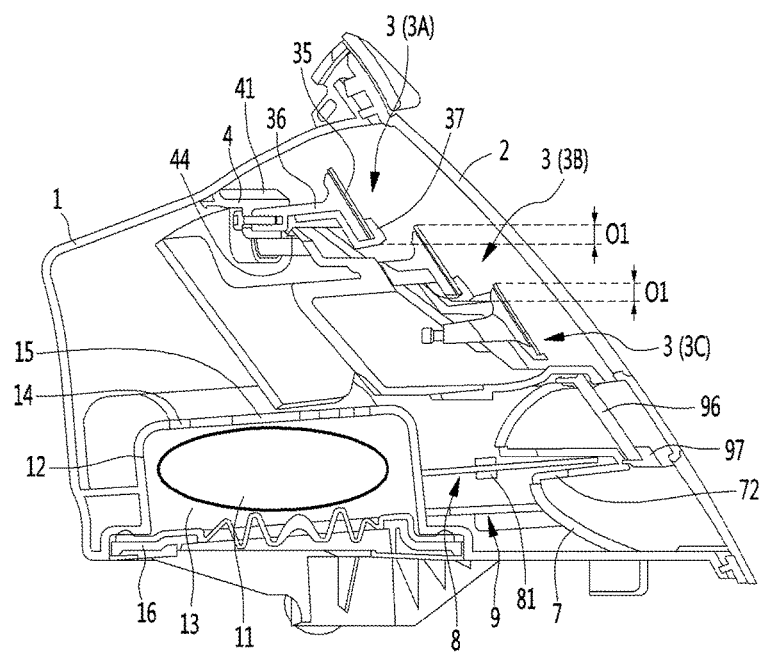
FIG. 5 is a diagram illustrating an example of a longitudinal sectional view of a lamp module for a vehicle according to some implementations.
Figure 6:
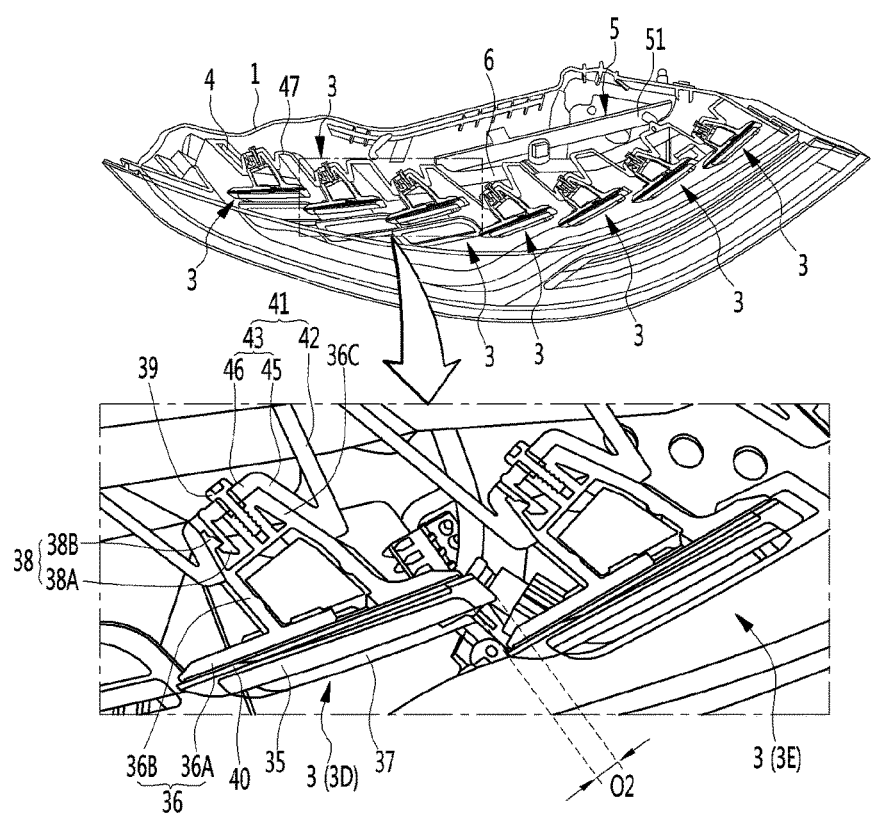
FIG. 6 is a diagram illustrating an example of a transverse sectional view of a lamp module for a vehicle according to some implementations.
Figure 7:
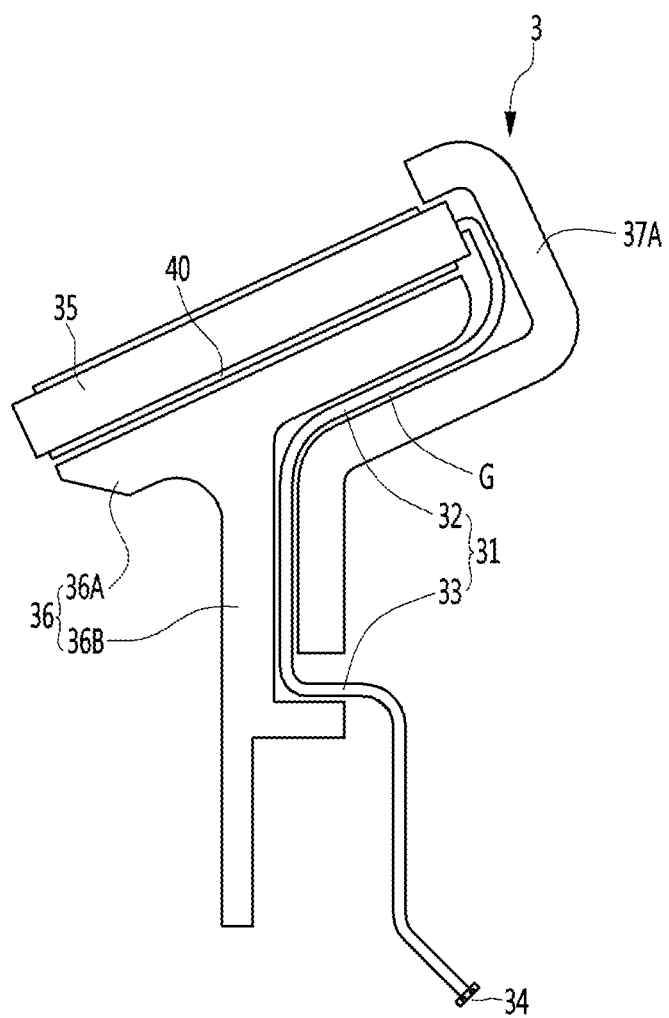
FIG. 7 is a diagram illustrating an example of a longitudinal view of an OLED module of a lamp module for a vehicle according to some implementations.
Figure 8:
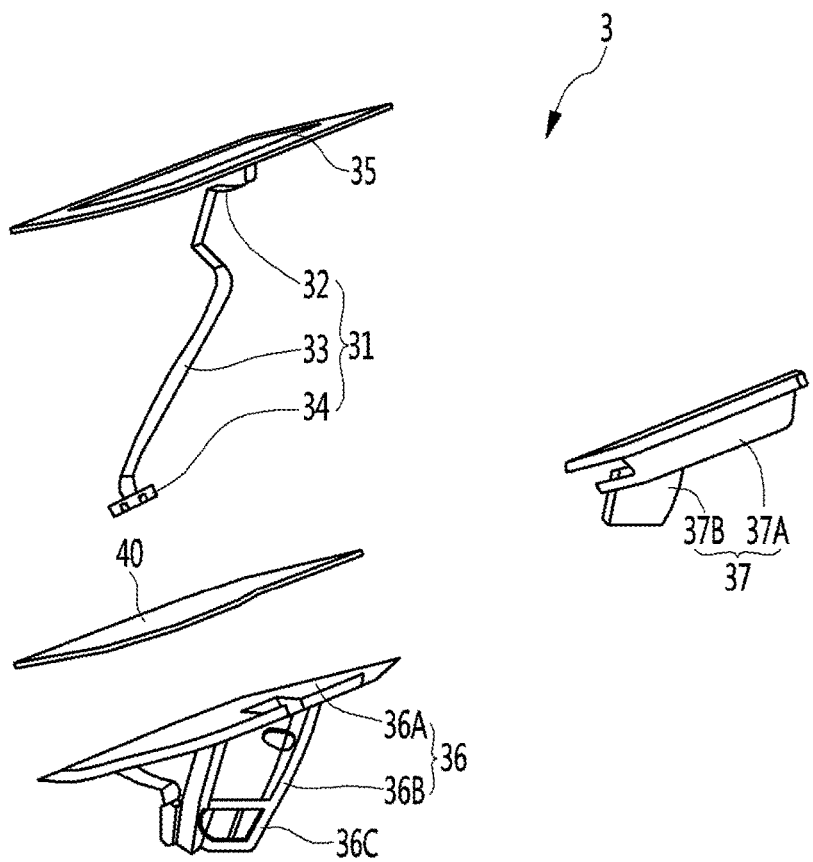
FIG. 8 is a diagram illustrating an example of an exploded perspective view of an OLED module of a lamp module for a vehicle according to some implementations.

FIG. 2 is a front view illustrating the inside of the lamp module for a vehicle according to some implementations, FIG. 3 is a front view illustrating when the drive module in FIG. 2 is separated, FIG. 4 is an exploded perspective view illustrating the lamp module for a vehicle according to some implementations, FIG. 5 is a longitudinal sectional view illustrating the lamp module for a vehicle according to some implementations, FIG. 6 is a transverse sectional view illustrating the lamp module for a vehicle according to some implementations, FIG. 7 is a longitudinal view illustrating OLED module of a lamp module for a vehicle according to some implementations, and FIG. 8 is an exploded perspective view illustrating OLED module of a lamp module for a vehicle according to some implementations.

The lamp assembly for a vehicle according to the present implementation includes a housing 1 which has a space S; an outer lens 2 which covers the space S; a plurality of OLED modules 3; a bezel 4 which is disposed on the space S and on which the plurality of OLED modules 3 is mounted in a separated manner from each other; a drive module 5 which controls the plurality of OLED modules 3; and a connecting flexible circuit board 6 to which each of the plurality of OLED modules 3 is connected and which is connected to the drive module 5. The connecting flexible circuit board 6 may be disposed on at least one of the housing 1 or the bezel 4.

As described further below, the bezel 4 may be configured to mount the plurality of OLED modules 3 by using a plurality of holders (e.g., holders 36 of FIGS. 5 to 8) on which the OLEDs are mounted. The bezel 4 may be configured to mount the plurality of OLED modules 3 at different angles by implementing different angles of the holders.

The lamp assembly for a vehicle may further include a reflector 7 which is disposed on the space S, at least one LED module which is mounted on the reflector 7, and an LED drive module 9 which is mounted on the reflector 7 and which controls the LED module 8. The LED module 8 may have at least one LED 81.

The lamp assembly for a vehicle may have a dual lamp assembly which has both the plurality of OLED modules 3 and the LED modules 8. In this case, the lamp assembly for a vehicle may implement more various illumination patterns. The lamp assembly for a vehicle may be constituted by a rear combination lamp which is installed on the rear side of a vehicle.

The housing 1 may form an appearance of the lamp assembly for a vehicle. The housing 1 may include a fastening portion which is mounted on a vehicle. The fastening portion may be fastened to the body of a vehicle or the trunk of a vehicle by a fastening member such as a screw.

A rear surface of the housing 1 may be opened and a space S may be formed in an inside portion of the housing. The rear surface of the housing 1 may be opened and an upper surface, a lower surface, a right side surface, a left side surface, and a rear surface thereof may have closed shapes. The housing 1 may formed to be lengthened in the horizontal direction.

As illustrated in FIG. 4 and FIG. 5, the housing 1 may include a dehumidifying bag housing portion 12 in which a dehumidifying bag 11 is housed.

The dehumidifying bag 11 may be a dry bag in which a water adsorbent in which water in air is absorbed is filled.

The dehumidifying bag housing space 13 in which the dehumidifying bag 11 is housed may be formed in the dehumidifying bag housing portion 12. A through hole 14 through which air is passed may be formed in the dehumidifying bag housing portion 12.

The dehumidifying bag housing portion 12 may be formed on the lower portion of the housing 1. The dehumidifying bag housing portion 12 may be projected toward the space S from the lower plate portion of the housing 1. The dehumidifying bag housing portion 12 may be a box-shape of which a bottom surface is opened and an upper surface, a front surface, a rear surface, a left surface and a right surface are closed.

A cable through hole 15 through which a cable for updating software passes may be formed in the dehumidifying bag housing portion 12. The cable through hole 15 may have a greater size than the size of the through hole 14.

A service provider or a manufacturer causes the cable through hole 15 to be passed through after introducing a cable into the dehumidifying bag housing space 13 from outside of the housing 1, and then the cable to connect to the drive module 5 disposed within the housing 1 or a connector PCB 55 to be described below.

The service provider or the manufacturer may update the program of the lamp assembly for a vehicle through the cable disposed to be pass through the dehumidifying bag housing space 13 and the cable through hole 15.

The dehumidifying bag housing space 13 and the space S may be communicated with by the through hole 14 and the cable through hole 15 and a humidity of the space S may be minimized.

The lamp assembly for a vehicle may further include a dehumidifying bag cover 16 blocking a lower surface of the dehumidifying bag housing portion 12. The dehumidifying bag cover 16 may be fastened to the lower surface of the housing 1 by a fastening member such as a hook portion of a hook, or the like, or a screw.

The dehumidifying bag 11 housed in the dehumidifying bag housing space 13 may be drawn out of the housing 1 in a state where the dehumidifying bag cover 16 is separated from the house 1, and a new dehumidifying bag may be inserted into the dehumidifying bag housing space 13.

The outer lens 2 may block a rear surface of the housing 1. A front surface of the outer lens 2 may be headed to the space S and a rear surface of the outer lens 2 may be exposed to outside of a vehicle.

The plurality of OLED modules 3, the bezel 4, the drive module 5 and the connecting flexible circuit board 6 may be housed between the outer lens 2 and the housing 1 and may be protected by the outer lens 2 and the housing 1.

The reflector 7, at least one of LED module 8, and the LED drive module 9 may be housed between the outer lens 2 and the housing 1 and may be protected by the outer lens 2 and the housing 1.

The outer lens 2 may be formed to be transparent or semi-transparent so that light transmits through the outer lens 2. A decorative pattern for maximizing decorating beauty may be formed in the outer lens 2 and the decorative pattern may be formed by printing or the like.

As illustrated in FIG. 5 to FIG. 8, each of the plurality of OLED modules 3 may include a module flexible circuit board 31, the OLED 35 to which the module flexible circuit board 31 is connected, and a holder 36 which is mounted to the bezel 4 and to which OLED 35 is coupled.

Each of the plurality of OLED modules 3 may further include the clip bezel 37. The clip bezel 37 may be coupled to the holder 36. The clip bezel 37 may cover a portion of the module flexible circuit board 31.

Each of the plurality of OLED modules 3 may further include an adhesive material 40 disposed between OLED 35 and the holder 36. The adhesive material 40 causes the OLED 35 to be coupled to the holder 36.

An end of the module flexible circuit board 31 may be connected to the OLED 35. A portion of the module flexible circuit board 31 may be disposed between the holder 36 and the clip bezel 37 along the outer surface of the holder 36. A portion of the module flexible circuit board 31 may be fixed by the holder 36 and the clip bezel 37 and thus may be protected.

The portion between the outer lens 2 and the bezel 4 may be visible through the outer lens 2 in the lamp assembly for a vehicle. The module flexible circuit board 31 preferably is invisibly disposed when viewed from the outside.

A portion of the module flexible circuit board 31 may be positioned in a gap G between the holder 36 and the clip bezel 37. A portion of the module flexible circuit board 31 may be concealed by the clip bezel 37 and may be protected by the clip bezel 37.

The module flexible circuit board 31 may extend to be connected to the connecting flexible circuit board 6 without being visible from the outside.

The module flexible circuit board 31 may include a concealing portion 32 and an extending portion 33. The concealing portion 32 may be concealed by the clip bezel 37 between the clip bezel 37 and the holder 36. The extending portion 33 may extend from the concealing portion 32 and may extend in the front side of the bezel 4 through the holder mounting portion 41 of the bezel 4.

The concealing portion 32 may be a portion which positions between the clip bezel 37 and the holder 36 among the module flexible circuit board 31.

The extending portion 33 may be a portion other than the concealing portion 32 among the module flexible circuit board 31.

In some implementations, the module flexible circuit board 31 may be connected to the connecting flexible circuit board 6. The module flexible circuit board 31 may include a connector 34. The connector 34 may be detachable from the connecting flexible circuit board 6. The connector 34 may be provided to the extending portion 33.

The connector 34 may be connected to the connecting flexible circuit board 6 at a front side of the bezel 4. The connector 34 may pass through the through hole 44 formed on the bezel 4 and may be connected to the connecting flexible circuit board 6 at the front side of the bezel 4.

The connector 34 may be detachable from the OLED module connector 63 to be described below of the connecting flexible circuit board 6.

Any one of the connector 34 and the OLED module connector 63 may be a female connector. The other one of the connector 34 and the OLED module connector 63 may be a male connector which is detachable from the female connector.

The OLED 35 may be a display using a self-luminous phenomenon emitting light when the current flows into the fluorescent organic compound. In some scenarios, the OLED 35 may have an advantage that a reaction rate is fast and an advantage that is configured to rapidly respond compared to the other light source at the time of operation of the driver.

One or more of the plurality of OLED modules 3 may be selectively turned ON and thus may form various illumination patterns. One or more of the plurality of OLED modules 3 may be sequentially turned ON or sequentially OFF and thus may form an animation illumination pattern. The OLED 35 may more quickly respond to various illumination patterns since reaction speed is fast compared to other light sources such as a halogen lamp.

The overall shape of the OLED 35 may be a plate shape. One surface of the OLED 35 may face the holder 36. The other surface of the OLED 35 may face the outer lens 2.

The surface facing the holder 36 among OLED 35 may attach to an adhesive material 40.

The surface facing the outer lens 2 among OLED 35 may be a light emitting surface.

A portion of the holder 36 may be mounted to be inserted into the holder mounting portion 41 of the bezel 4.

The holder 36 may include the inclined portion 36C. At least a portion of the inclined portion 36C may be inserted into an expansion portion 45 to be described below and be housed.

The inclined portion 36C may be formed to have a gradually expanding shape with decreasing distance to the outer lens 2. The inclined portion 36C may be inserted into the inside portion of the expansion portion 45 from the rear side of the expansion portion 45 of the bezel 4.

In some implementations, the bezel 4 may formed by a mold. The expansion portion 45 may, for example, be formed to have a gradually expanding shape in order to be easily removable from the mold. The expansion portion 36C formed to gradually expand in a direction closer to the outer lens 2 may be formed to correspond to the inside shape of the expansion portion 45 and may be in close contact with the inner surface of the expansion portion 45.

The holder 36 may include an OLED fixing portion 36A to which the adhesive material is attached, and a mounter portion 36B which is projected from the OLED fixing portion 36A and which is mounted on the bezel 4.

A portion of the mounter portion 36B may be inserted into the holder mounting portion 41 of the bezel 4. The inclined portion 36C may be a portion of the mounter portion 36B and may be a portion which is inserted into the holder mounting portion 41 among the mounter portion 36B.

The holder 36 may be fixed to the bezel 4 by the fastening member 39 such as a screw after being temporarily assembled to the bezel 4 by a hook 38.

The hook 38 which hooks the holder 36 to the bezel 4 may be formed on at least one of the bezel 4 or the holder 36.

The hook 38 may include a hook portion 38A which projects from the any one of the holder 36 or the bezel 4. The hook 38 may further include a hook catching portion 38B in which a hook portion 38A is elastically hooked. The hook catching portion 38B may be formed on the other one of the holder 36 and the bezel 4.

The fastening member 39 may be configured so that the holder 36 is fastened to the bezel 4. The fastening member 39 may fasten the holder 36 to the bezel 4 in a state where the holder 36 is temporarily assembled to the bezel 4 by a hook 38.

The clip bezel 37 may include a clip portion 37A. The clip portion 37A may surround a portion of the OLED 35 and a portion of the holder 36.

In some implementations, a cross sectional shape of the clip portion 37A may be formed in a "∪" shape. A portion of the OLED 35 and a portion of the holder 36 may be inserted into the inside of the clip portion 37A and be fitted to the inside of the clip portion 37A.

In some implementations, the clip portion 37A may include two plate portions which face each other. The two plate portions may be spaced apart from each other. The clip portion 37A may further include a connecting plate portion which connects two plate portions to each other.

In a scenario in which a portion of the OLED 35 and a portion of the holder 36 are inserted into the inside of the clip portion 37A, the two plate portions of the clip portion 37A which face each other may be elastically deformed in a shape that a distance between the two plate portions is increased.

Any one of the two plate portions of the clip portion 37A may press a portion of the holder 36 to the OLED 35. The other one of the two plate portions of the clip portion 37A may press a portion of the OLED 35 to the holder 36.

The clip bezel 37 may include a shielding portion 37B. The shielding portion 37B may extend from the clip portion 37A. The shielding portion 37B may be projected from one of the two plate portions of the clip portion 37A. The shielding portion 37B may be spaced apart from the mounter portion 36B of the holder 36. A gap G in which a portion of the module flexible circuit board 31 is positioned may be formed between the shielding portion 37B and the mounter portion 36B. The shielding portion 37B may cover and protect a portion of the module flexible circuit board 31 which is positioned between the mounter portion 36B and the shielding portion 37B.

In some implementations, the plurality of OLED modules may be arranged to be overlapping with each other. As illustrated in the example of FIG. 5, the plurality of OLED modules 3 may have an overlapping zone O1 in which any one among the plurality of OLED modules 3 which are spaced apart in the vertical direction is overlapped with a portion of another OLED module positioned on the upper side thereof. Portions of the OLED modules 3 spaced apart in the vertical direction among the plurality of OLED modules 3 may be overlapped with each other in a front and rear direction.

Two OLED modules may be disposed to be spaced apart in the vertical direction. Hereinafter, as illustrated in FIG. 5, a case where three OLED modules 3A, 3B, and 3C are disposed to be spaced apart in the vertical direction will be described. However, implementations are not limited to the case where three OLED modules 3A, 3B, and 3C are disposed to be spaced apart in the vertical direction and it is also possible for two or four OLED modules to be disposed to be spaced apart in the vertical direction.

Hereinafter, for convenience of description, an OLED module which positions on the upper side refers to as an upper side OLED module 3A, an OLED module which positions on the lower side refers to as a lower side OLED module 3C, and an OLED module which positions on the center refers to as a center OLED module 3B, among three OLED modules 3A, 3B, and 3c which are spaced apart from each other in the vertical direction.

The center OLED module 3B may be spaced apart from the upper side OLED module 3A in the vertical direction. The upper portion of the center OLED module 3B may conceal a portion of a lower portion of the upper side OLED module 3A.

The clip bezel 37 of the upper side OLED module 3A may surround the lower portion of the holder 36 of the upper side OLED module 3A and the lower portion of OLED 35 of the upper side OLED module 3A. The upper portion of the holder 36 of the center OLED module 3B may conceal at least a portion among the clip bezel 37 of the upper side OLED module 3A.

In a scenario in which both the upper side OLED module 3A and the center OLED module 3B are turned ON, light that is emitted from two OLED modules 3A which are spaced apart in the vertical direction may appear to be integrated. For example, the clip bezel 37 or the bezel 4 which is seen between light generated from the upper side OLED module 3A and light generated from the center OLED module 3B may be minimized.

In some implementations, the lower side OLED module 3C may be spaced apart from the center OLED module 3B in the vertical direction. The upper portion of the lower side OLED module 3C may conceal a portion of a lower portion of the center OLED module 3B.

The clip bezel 37 of the center OLED module 3B may surround the lower portion of the holder 36 of the center OLED module 3B and the lower portion of OLED 35 of the center OLED module 3B. The upper portion of the holder 36 of the lower side OLED module 3C may conceal at least a portion among the clip bezel 37 of the center OLED module 3B.

In a scenario in which both the center OLED module 3B and the lower side OLED module 3C are turned ON, light that is emitted from two OLED modules 3B and 3C which are spaced apart in the vertical direction may appear to be integrated. As such, the clip bezel 37 or the bezel 4 which is seen between light generated from the center OLED module 3B and light generated from the lower side OLED module 3C may be minimized.

As illustrated in FIG. 6, the plurality of OLED modules 3 may have an overlapping zone O2 in which any one holder which is spaced apart in the horizontal direction is overlapped with a portion of the other OLED module positioned beside thereof.

At least two OLED modules among the plurality of OLED modules 3 may be disposed to be spaced apart from each other in the horizontal direction. Hereinafter, for convenience of description, overlapping between an OLED module 3D which positions on the left side and an OLED module 3E which positions on the right side, among two OLED modules which is adjacent to each other will be described. Hereinafter, for convenience of description, an OLED module 3D which positions on the left side among two OLED modules refers to as a left side OLED module 3D, and an OLED module 3E which positions on the right side among two OLED modules refers to as a right side OLED module 3E.

As illustrated in FIG. 6, the two OLED modules 3D and 3e which are adjacent to each other may be disposed to be spaced apart in the horizontal direction and the right side OLED module 3E may be spaced apart from the left side OLED module 3D in the horizontal direction. Any one of the right side OLED module 3E and the left side OLED module 3D may be disposed to conceal a portion of the other one of the right side OLED module 3E and the left side OLED module 3D which positions beside of any one of the right side OLED module 3E and the left side OLED module 3D.

The holder 36 of the right side OLED module 3E may be disposed to conceal a portion of a right portion of the left side OLED module 3D.

In a scenario in which both the left side OLED module 3D and the right side OLED module 3E are turned ON, light that is emitted from two OLED modules 3D and 3E which are spaced apart in the horizontal direction may appear to be integrated. As such, the bezel 4 which is seen between light generated from the left side OLED module 3D and light generated from the right side OLED module 3E may be minimized.

The bezel 4 may include a plurality of holder mounting portions 41. The plurality of holder mounting portions 41 may be formed on the bezel 4 to be spaced apart from each other. The plurality of holder mounting portions 41 may be formed to be spaced apart in the vertical direction and may be formed to be spaced apart in the horizontal direction.

In some implementations, the plurality of holder mounting portions 41 may all have the same mounting angle at which they mount the holder 36. For example, the mounting angle may be uniformly in a first direction. However, implementations are not limited thereto, and one or more of the plurality of holder mounting portions 41 may have different mounting angles at which they mount the holder 36. For example, some mounting angles may be formed in a second direction which is different from a first direction in which other mounting angles are formed.

For example, in a case where the first direction is the vertical direction, the second direction may be the horizontal direction. In this case, as illustrated in the example of FIG. 5, the plurality of OLEDs which are spaced apart in the vertical direction may be configured to emit light in a direction parallel to each other.

As another example, as illustrated in FIG. 6, the plurality of OLEDs which are spaced apart in the horizontal direction may be configured to emit light in the different directions to each other in the horizontal direction. As such, the plurality of OLEDs are configured to emit light more widely in the horizontal direction and emit light over a wide range of the rear side of the vehicle.

The rear surface of the plurality of OLED which are spaced apart in the horizontal direction may be disposed toward the rear side direction of a vehicle as the plurality of OLED are closer to the center of a vehicle.

The rear surface of the plurality of OLED which are spaced apart in the horizontal direction may be disposed toward the inclined direction beside of the rear side of a vehicle as the plurality of OLED are closer to the side surface of a vehicle.

In the present implementation, a first direction may be the horizontal direction and a second direction may be the vertical direction. In this case, the plurality of OLED modules 3A, 3B and 3C which are spaced apart from each other in the vertical direction may emit light in the different direction from each other in the vertical direction and the plurality of OLED modules 3D and 3E which are spaced apart from each other in the horizontal direction may emit light in parallel in the horizontal direction.

As illustrated in FIG. 5 and FIG. 6, each of the plurality of holder mountings 41 may include a projecting portion 42 which is projected toward the outer lens 2 and a holder pocket 43 into which a portion of the holder 36 is inserted and is housed.

The projecting portion 42 may be formed to be projected in the direction toward the outer lens 2 from the main body 47 of the bezel 4. The projecting portion 42 may be projected in a hollow cylindrical shape and a space in which a portion of the holder pocket 43 is housed may be formed in the inside portion of the projection portion.

The holder pocket 43 may be positioned in the inside of the projecting portion 42 by being depressed from the projecting portion in the opposite direction to the outer lens 2.

The holder pocket 43 may be formed to project from rear end of the projecting portion to the inside portion of the projecting portion. The holder pocket 43 may formed so that the rear surface thereof is opened.

The through hole 44 (see FIG. 2 and FIG. 5) through which the module flexible circuit board 31 passes may be formed on the holder pocket 43.

The extending portion 33 and the connector 34 of the module flexible circuit board 31 may get out to the front side of the bezel 4 through the through hole 44 formed in the bezel 4. The connector 34 may be coupled to the connecting flexible circuit board 6 attached to the front surface of the bezel 4 at the front side of the bezel 4. The connector 34 may be coupled to the OLED module connector 63 of the connecting flexible circuit board 6.

The holder pocket 43 may include an expansion portion 45 which is gradually expanded as being closer to the outer lens 2. The holder pocket 43 may further include a holder fastening portion 46 which is fastened with the holder 36.

The holder pocket 43 may be formed in a shape which easily gets out of a mold forming the bezel 4. The bezel 4 is easily get out of the mold forming the bezel 4 by the expansion portion 45 being formed in a gradually expanding shape.

The holder fastening portion 46 may be integrally formed with the expansion portion 45. The holder fastening portion 46 plays a role as a stopper which prevents the holder 36 from excessively inserting at the time of mounting of the holder 36.

Any one of the hook portion 38A and the hook catching portion 38B may be projected on the holder fastening portion 46. The fastening member through hole which is disposed to be passed through the fastening member 39 may be formed in the holder fastening portion 46. The fastening member 39 may be coupled to the mounter portion 36B of the holder 36 through the fastening member through hole formed on the holder pocket 43. The fastening member 39 may be coupled to a boss portion formed on the mounter portion 36B by a screw.

In some implementations, as illustrated in FIG. 3 and FIG. 4, the lamp assembly for a vehicle may further includes a bezel top 49. The bezel top 49 may be disposed to surround at least a portion of the border of the bezel 4.

The bezel top 49 may be coupled to the bezel 4 by a fastening member such as hook portion of hook, or the like, or a screw and may be integrated with the bezel 4.

The drive module 5 may include a PCB 51, and a control component controlling the plurality of OLED modules 3 by being installed on the PCB 51.

The drive module 5 may include a connecting flexible circuit board connector 53 to which the connecting flexible circuit board 6 is connected.

The main connector 64 to be described below of the connecting flexible circuit board 6 may be separably coupled to the connecting flexible circuit board connector 53.

The connecting flexible circuit board connector 53 may be installed on the PCB 51. Any one of the connecting flexible circuit board connector 53 and the main connector 64 may be constituted by a male connector. The other one of the connecting flexible circuit board connector 53 and the main connector 64 may be constituted by a female connector into which the male connector is inserted and is fitted.

The drive module 5 may connected to any one of the LED module 8 and a LED drive module 9 by a wire. The wire connector 54 for being connected by a wire 91 may be installed in the drive module 5.

The wire connector 54 may be installed on the PCB 51. The wire connector 54 may be detachable from a sub connector 92 which is provided on the wire. Any one of a wire connector 54 and a sub connector 92 may be constituted by a male connector. The other one of a wire connector 54 and a sub connector 92 may be constituted by a female connector into which the male connector is inserted and is fitted.

The drive module 5 may be connected to a connector PCB 55. The drive module 5 may be connected to a connector PCB 55 by a sub wire 56. The drive module 5 may include a sub wire connector 57 to which the sub wire 56 is coupled separably.

The sub wire connector 57 may be installed on the PCB 51. The sub wire connector 57 may be separably coupled to one end connector 58 of the sub wire 56. Any one of a sub wire connector and one end connector 58 may be constituted by a male connector. The other one of a sub wire connector 57 and one end connector 58 may be constituted by a female connector into which the male connector is inserted and is fitted.

As illustrated in FIG. 2 to FIG. 4, the connecting flexible circuit board 6 may include a plurality of first connecting flexible circuit boards 61. The plurality of first flexible circuit boards 61 may be connected to the module flexible circuit board 31. The plurality of first flexible circuit boards 61 may be disposed on the bezel 4 to be spaced apart from each other. The connecting flexible circuit board 6 may further include at least one the second flexible circuit board 62 which connects the plurality of a first flexible circuit boards 61.

As illustrated in FIG. 3, the connecting flexible circuit board 6 may attached to the front surface of the bezel 4. The connecting flexible circuit board 6 may attached to the front surface of the bezel 4 by a double-side adhesive material, or the like.

The connecting flexible circuit board 6 may include the OLED module connector 63 which is detachable from the OLED module 3. The OLED module connector 63 may be provided to a first flexible circuit board 61 or a second flexible circuit board 62.

The plurality of first flexible circuit boards 61 may be disposed to be spaced apart from each other in the horizontal direction.

A plurality of OLED module connectors may be provided on each of the plurality of first flexible circuit boards 61. For example, in a case where three OLED module connectors 63 may be provided on the first flexible circuit board 61, three OLED modules 3 are connected to the first flexible circuit board 61.

A plurality of OLED module connectors 63 provided in the first flexible circuit board 61 may be disposed to be spaced apart from each other in the longitudinal direction of the first flexible circuit board 61.

The second flexible circuit board 62 connects two first flexible circuit boards 61 which is adjacent to each other and at least one second flexible circuit board 62 may be disposed between the two first flexible circuit boards 61.

The connecting flexible circuit board 6 may connect the plurality of first connecting flexible circuit boards 61 which are spaced apart in the horizontal direction by the second connecting flexible circuit board 61.

The connecting flexible circuit board 6 may be constituted by a combination body of the plurality of flexible circuit boards. The connecting flexible circuit board 6 may connect the plurality of OLED module 3 and the drive module 5 to each other.

A wire may be used instead of the connecting flexible circuit board 6 of the present implementation. However, in this case, an inner structure of the lamp assembly for a vehicle may be too complicated and a wire interconnection structure may be complicated.

On the contrary, as in the present implementation, in a case where the connecting flexible circuit board 6 which is a combination body of the plurality of flexible circuit boards may be used, the inner structure of the lamp assembly for a vehicle may be simplified. The lamp assembly for a vehicle may be generally made compact.

The connecting flexible circuit board 6 may include the main connector 64 which is detachable from the drive module 5. The main connector 64 may be provided to a first flexible circuit board 61 or a second flexible circuit board 62. An extension portion 65 may extend on a side of the first flexible circuit board 61 or the second flexible circuit board 62 and the main connector 64 may be connected to the extending portion 65.

Here, the extending portion 65 preferably has a length which is considered the distance difference of the connecting flexible circuit board 6 and the drive module 5. The extending portion 65 preferably has a distance which is longer than the distance between the connecting flexible circuit board 6 and the drive module 5.

In some implementations, the reflector 7 may reflect light emitted from the LED 81 to the outer lens 2. The reflector 7 may be installed to be positioned between the outer lens 2 and the housing 1. The reflector 7 may be fastened on the bezel 4 or the housing 1 by a fastening member such as a hook portion of a hook, or the like or a screw.

The reflector 7 may be a mounter on which a LED module 8 and a LED drive module 9 are mounted and is configured to protect the LED module 8 and the LED drive module 9.

A transmitting hole 71 through which light emitted from the LED 81 of the LED module 8 transmits may be formed on the reflector 7. The transmitting hole 71 may be formed to be lengthened in the horizontal direction. The transmitting hole 71 may be formed to be opened in the front and rear direction on the rear side or the periphery of the LED module 8. The reflector 7 may have an LED module insertion portion into which a portion of the LED module 8 is inserted. The LED module insertion portion may be formed to be larger than the rear side portion of the LED module 8. The LED module insertion portion may be opened in the same shape as the shape of the rear side portion of the LED module 8.

The LED module 8 may be configured to be detachable from the reflector 7. The LED module 8 may include the LED PCB 83. At least one LED 81 may be mounted on the LED PCB 83.

The LED module 8 may include a plurality of LEDs 81 disposed to be spaced apart from each other in the LED PCB 83. The plurality of LEDs 81 may be disposed to be distributed on the upper surface of the LED PCB 83 and the lower surface of LED PCB 83. The plurality of LEDs 81 may include at least one upper LED which is disposed on the upper surface of LED PCB 83 and at least one low LED which is disposed on the lower surface of the LED PCB 83.

A male connector 82 may be provided in any one of the LED module 8 and LED drive module 9. A female connector 92 to which the male connector 82 is coupled is provided on the other one of the LED module 8 and LED drive module 9. The male connector 82 may be disposed to be projected from any one of the LED module 8 and a LED drive module 9 toward the other one of the LED module 8 and a LED drive module 9. The female connector 92 may be disposed to be projected from the other one of the LED module 8 and a LED drive module 9 toward any one of the LED module 8 and a LED drive module 9.

The LED drive module 9 may include a drive PCB 93 disposed to be spaced apart from the LED module 8. The drive PCB 93 may be connected by the female connector 92 and the male connector 82.

The size of the LED drive module 9 may smaller than the size of the LED module 8. The LED drive module 9 may disposed side by side with the LED module 8.

The lamp assembly for a vehicle may further include an optic lens 96 disposed on the rear side of the reflector 7. The optical lens 96 may be disposed to cover the transmitting hole 71 on the rear surface of the reflector 7. Light emitted from the LED 81 may be reflected to the optical lens 96 by the reflector 7 and light transmits through the optical lens 96 and then may be emitted toward the outer lens 2.

The lamp assembly for a vehicle may further include a bezel optical lens 97. The bezel optical lens 97 may be a light shielding portion which shields light reflected from the reflector 7. The bezel optical lens 97 may be coupled to the reflector 7. The lower portion of the optical lens 96 may be placed on the bezel optical lens 97. The bezel optical lens 97 may be formed to surround the border of the optical lens 96. An opening portion through which light transmitted through the optical lens 96 passes may be formed in the bezel optical lens 97.

Light reflected in the rear direction from the reflector 7 may transmit through the optical lens 96, does not transmit through the bezel optical lens 97, transmits through the opening portion of the bezel optical lens 97 and emit to the outer lens 2.

Figure 9:
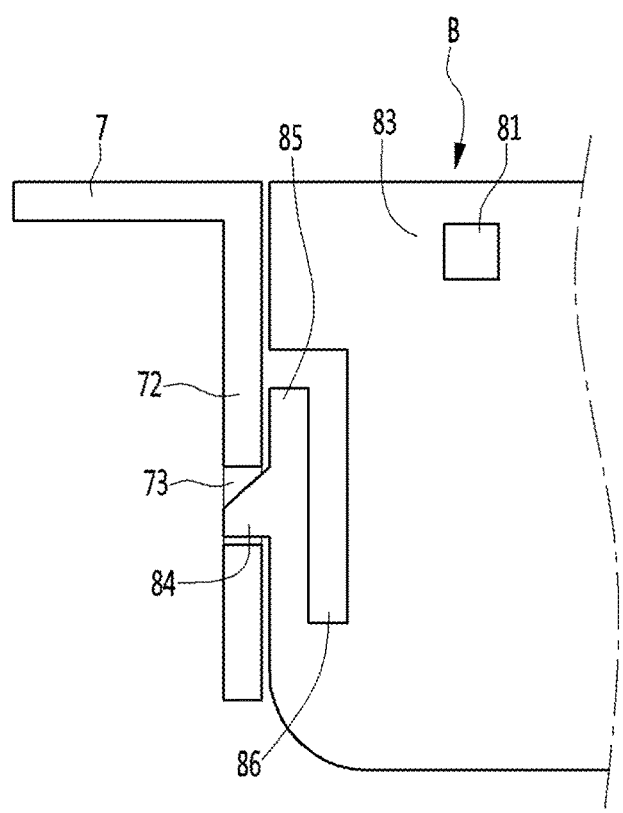
FIG. 9 is a diagram illustrating an example of a sectional view taken along the line C-C in the example illustrated in FIG. 3.
Figure 10:
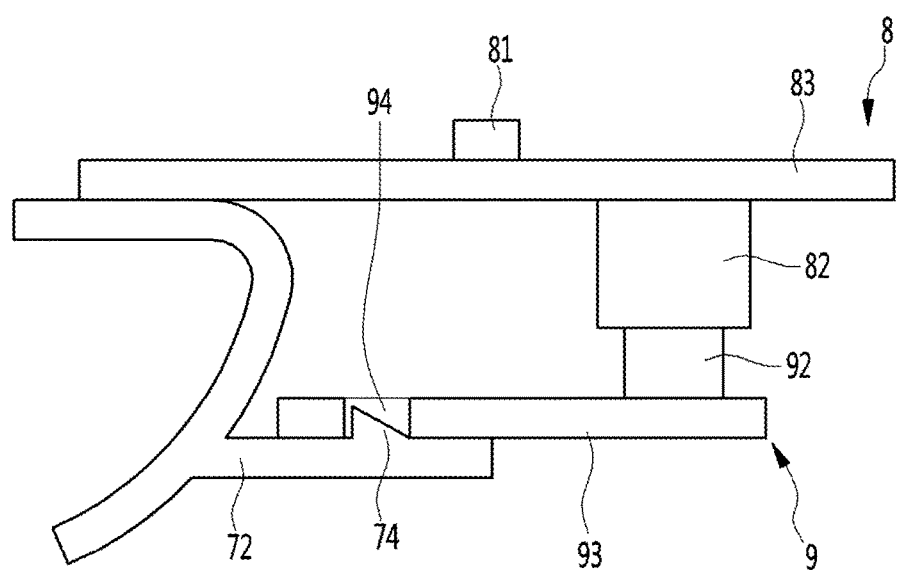
FIG. 10 is a diagram illustrating an example of a sectional view taken along line D-D in the example illustrated in FIG. 3.

FIG. 9 is a sectional view taken along C-C line illustrated in FIG. 3 and FIG. 10 is a sectional view taken along D-D line illustrated in FIG. 3.

A hook 84 and a slit 86 helping an elastic deformation of the hook 84 may be formed in the at least one of the LED module 8 and the LED drive module 9. The hook 84 may be coupled to the module mounting portion 72 formed on the reflector 7.

The hook 84 and the slit 86 may be formed on the LED module 8 and help mounting and separating of the LED module 8.

The module mounting portion 72 may be integrally projected or be configured as a separated member from the reflector 7, and may be mounted to the reflector 7 by a fastening member such as a hook portion of a hook, or the like or a screw.

The module mounting portion 72 of the reflector 7 may be projected in the front side direction and a hook hole 73 into which hook 84 is inserted and fitted may be formed on a side in the front and rear direction of the module mounting portion 72.

The hook 84 may be projected in the lateral direction on a side end of the LED PCB 83 of the LED module 8.

The slit 86 may be formed to be lengthened along the periphery of a lever portion 85 to which the hook 84 is projected. At the time of mounting and extracting of the LED module 8, the lever portion 85 on which the hook 84 is formed may be elastically deformed by slit 86 and the hook 84 may be slid according to the module mounting portion 72.

In some implementations, the LED drive module 9 may be detachable from the module mounting portion 72 of the reflector 7. The hook 74 may be formed on any one of the module mounting portion 72 and the drive PCB 93 of the LED drive module 9 and a hook hole 94 into which the hook 74 is inserted and hooked may be formed on the other one of the module mounting portion 72 and the drive PCB 93 of the LED drive module 9. At the time of the LED drive module 9, a portion on which a hook 74 among the module mounting portion 72 is formed helps insertion of the LED drive module 9 while elastically deforms, and when the hook hole 94 corresponds to the hook 74, the hook 74 may be inserted into the hook hole 94, and the LED drive module 9 may be mounted on module mounting portion 72.

Figure 11:
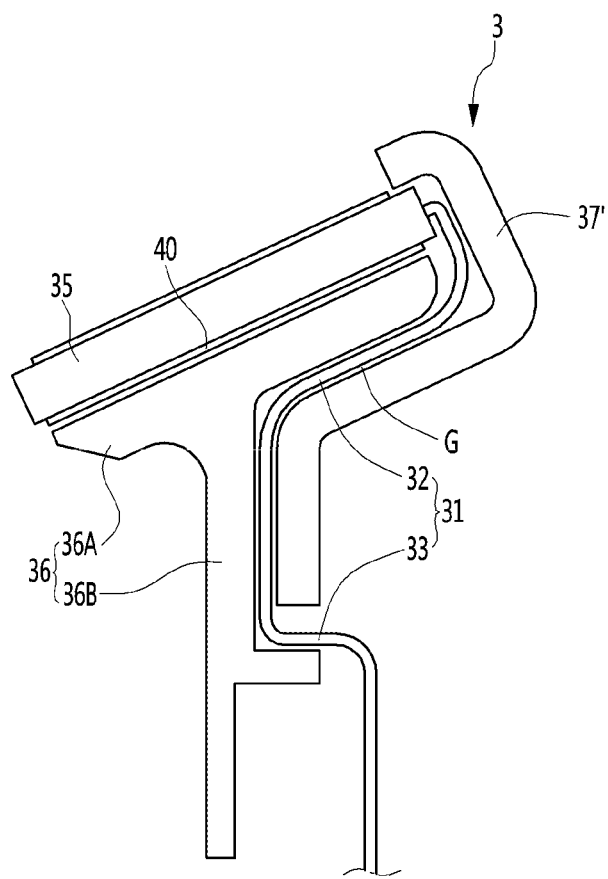
FIG. 11 is a diagram illustrating an example of a longitudinal sectional view of an OLED module of a lamp assembly for a vehicle according to another implementation.
Figure 12:
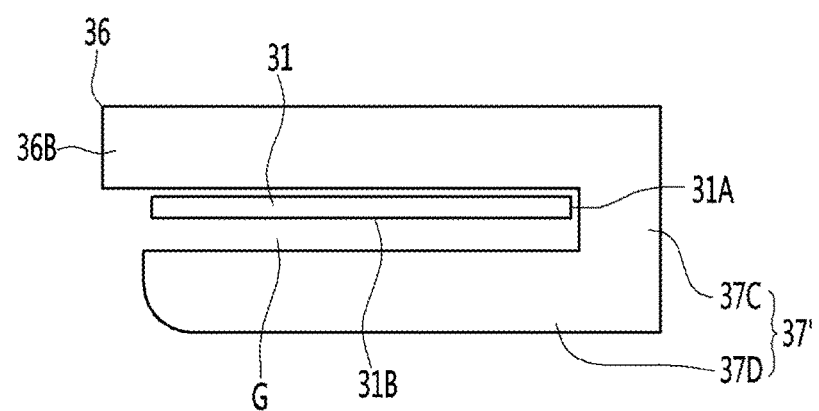
FIG. 12 is a diagram illustrating an example of a transverse sectional view of an OLED module of a lamp assembly for a vehicle according to another implementation.

FIG. 11 is a longitudinal sectional view illustrating OLED module of a lamp assembly for a vehicle according to another implementation, and FIG. 12 is a transverse sectional view illustrating OLED module of a lamp assembly for a vehicle according to another implementation.

Each of the plurality of OLED modules 3 of the present implementation may include a OLED 35 to which the module flexible circuit board 31 is connected; and a holder 36 which is mounted on the bezel 4 and to which the OLED 35 is coupled. Each of the plurality of OLED modules 3 may further include an adhesive material 40 disposed between OLED 35 and the holder 36. The adhesive material 40 causes the OLED 35 to be coupled to the holder 36.

The module flexible circuit board 31 may be connected to the connecting flexible circuit board 6.

The holder 36 may include a shielding portion 37' which conceals a portion of module flexible circuit board 31.

As in some implementations, the holder 36 may include both an OLED fixing portion 36A and a mounter portion 36B and the shielding portion 37' may be formed to integrally extend at one among the OLED fixing portion 36A and the mounter portion 36B A gap G in which a portion of the module flexible circuit board 31 is housed may be formed between at least one of the OLED fixing portion 36A and the mounter portion 36B and the shielding portion 37'.

A portion of the module flexible circuit board 31 may be inserted between at least one of the OLED fixing portion 36A and the mounter portion 36B and a shielding portion 37' from beside of the gap G.

The shielding portion 37' may include a first shielding portion 37C which shields a side end 31A of the module flexible circuit board 31 and a second shielding portion 37D which is formed in a bending shape from the first shielding portion 37C and covers a surface 31B of the module flexible circuit board 31.

The first shielding portion 37C may integrally extend from any one of the OLED fixing portion 36A and the mounter portion 36B.

The wire or the sub wire described in the present disclosure is a wiring hardness on which coating is overlaid on a metal wire, and for convenience of description, it is referred to as a sub wire.

The above description describes the technical idea of the present disclosure only by way of example. Accordingly, numerous other modifications and implementations may be devised.

Accordingly, implementations disclosed herein are merely illustrative and do not limit the technical scope of the present disclosure.

In addition, the protective scope of the present disclosure should be construed by the following claims, and all technical spirits within a scope equivalent to the protective scope will be construed as being included in the scope of the disclosure.

What is claimed is:

1. A lamp assembly for a vehicle, comprising:
   a housing that defines a space;
   an outer lens that covers the space defined by the housing;
   a bezel disposed on the space defined by the housing;
   a plurality of OLED modules mounted on the bezel that is disposed on the space defined by the housing, the plurality of OLED modules mounted to be separated from each other;
   a drive module configured to control the plurality of OLED modules; and
   a connecting flexible circuit board disposed on at least one of the housing or the bezel, to which each of the plurality of OLED modules is connected and which is connected to the drive module,
   wherein each OLED module of the plurality of OLED modules comprises:
      an OLED to which a module flexible circuit board is connected, and
      a holder mounted on the bezel and to which the OLED is coupled,
   wherein the module flexible circuit board is connected to the connecting flexible circuit board, and
   wherein the lamp assembly further comprises a hook that is configured to hook the holder to the bezel, the hook being formed on at least one of the bezel or the holder.

2. The lamp assembly for a vehicle according to claim 1, further comprising:
   a fastening member configured to fasten the holder to the bezel.

3. The lamp assembly for a vehicle according to claim 1, wherein the bezel comprises a plurality of holder mounting portions configured to mount the holder, and
   wherein the plurality of holder mounting portions are formed to be spaced apart from each other.

4. A lamp assembly for a vehicle, comprising:
   a housing that defines a space;
   an outer lens that covers the space defined by the housing;
   a bezel disposed on the space defined by the housing;
   a plurality of OLED modules mounted on the bezel that is disposed on the space defined by the housing, the plurality of OLED modules mounted to be separated from each other;
   a drive module configured to control the plurality of OLED modules; and
   a connecting flexible circuit board disposed on at least one of the housing or the bezel, to which each of the plurality of OLED modules is connected and which is connected to the drive module,
   wherein each OLED module of the plurality of OLED modules comprises:
      an OLED to which a module flexible circuit board is connected, and
      a holder mounted on the bezel and to which the OLED is coupled,
   wherein the module flexible circuit board is connected to the connecting flexible circuit board,
   wherein the bezel comprises a plurality of holder mounting portions configured to mount the holder,
   wherein the plurality of holder mounting portions are formed to be spaced apart from each other,
   wherein each of the plurality of holder mounting portions comprises:
      a projecting portion that projects towards the outer lens; and
      a holder pocket into which a portion of the holder is inserted and housed, and
   wherein the holder pocket is positioned in an inside of the projecting portion by being depressed in a direction that is opposite of the outer lens in the projecting portion.

5. The lamp assembly for a vehicle according to claim 4, wherein a through-hole which passes through the module flexible circuit board is defined on the holder pocket.

6. The lamp assembly for a vehicle according to claim 4, wherein the holder pocket comprises an expansion portion configured to expand with decreasing distance to the outer lens,
   wherein the holder comprises an inclined portion in which at least a portion of the holder is inserted into the expansion portion and is housed, and
   wherein the inclined portion is configured to expand with decreasing distance to the outer lens.

7. The lamp assembly for a vehicle according to claim 3, wherein each of the plurality of holder mounting portions has the same mounting angle for mounting the holder in a first direction, and
   wherein at least two of the plurality of holder mounting portions have different mounting angles for mounting the holder in a second direction different from the first direction.

8. The lamp assembly for a vehicle according to claim 1, wherein the each OLED module of the plurality of OLED modules further comprises a clip bezel coupled to the holder, and
   wherein the clip bezel covers a portion of the module flexible circuit board.

9. A lamp assembly for a vehicle, comprising:
   a housing that defines a space;
   an outer lens that covers the space defined by the housing;
   a bezel disposed on the space defined by the housing;
   a plurality of OLED modules mounted on the bezel that is disposed on the space defined by the housing, the plurality of OLED modules mounted to be separated from each other;
   a drive module configured to control the plurality of OLED modules; and
   a connecting flexible circuit board disposed on at least one of the housing or the bezel, to which each of the plurality of OLED modules is connected and which is connected to the drive module,
   wherein each OLED module of the plurality of OLED modules comprises:
      an OLED to which a module flexible circuit board is connected, and
      a holder mounted on the bezel and to which the OLED is coupled,
   wherein the module flexible circuit board is connected to the connecting flexible circuit board,
   wherein the each OLED module of the plurality of OLED modules further comprises a clip bezel coupled to the holder,
   wherein the clip bezel covers a portion of the module flexible circuit board,
   wherein the module flexible circuit board comprises a concealing portion and an extending portion that extends from the concealing portion, wherein the concealing portion is concealed by the clip bezel between the clip bezel and the holder in a state in which the clip bezel is coupled to the holder, and wherein the extending portion extends through a holder mounting portion formed on the bezel in a front side of the bezel.

10. The lamp assembly for a vehicle according to claim 9, wherein the module flexible circuit board comprises a connector that is detachable from the connecting flexible circuit board, and wherein the connector is provided in the extending portion.

11. A lamp assembly for a vehicle, comprising:
a housing that defines a space;
an outer lens that covers the space defined by the housing;
a bezel disposed on the space defined by the housing;
a plurality of OLED modules mounted on the bezel that is disposed on the space defined by the housing, the plurality of OLED modules mounted to be separated from each other;
a drive module configured to control the plurality of OLED modules; and
a connecting flexible circuit board disposed on at least one of the housing or the bezel, to which each of the plurality of OLED modules is connected and which is connected to the drive module,
wherein each OLED module of the plurality of OLED modules comprises:
an OLED to which a module flexible circuit board is connected, and
a holder mounted on the bezel and to which the OLED is coupled,
wherein the module flexible circuit board is connected to the connecting flexible circuit board, and
wherein the connecting flexible circuit board comprises:
a plurality of first flexible circuit boards to which a module flexible circuit board is connected and that is disposed on the bezel, the plurality of first flexible circuit boards spaced apart from each other, and
at least one second flexible circuit board that interconnects at least two of the plurality of first flexible circuit boards.

12. The lamp assembly for a vehicle according to claim 11, wherein the connecting flexible circuit board is attached to a front surface of the bezel.

13. The lamp assembly for a vehicle according to claim 11, wherein the connecting flexible circuit board comprises a main connector that is detachable from the drive module.

14. The lamp assembly for a vehicle according to claim 1, wherein the plurality of OLED modules are spaced apart from each other in a vertical direction, and a first OLED module among the plurality of OLED modules is overlapped with a portion of a second OLED module among the plurality of OLED modules that is positioned at an upper side of the first OLED module.

15. The lamp assembly for a vehicle according to claim 1, wherein the plurality of OLED modules are spaced apart from each other in a horizontal direction, and a first OLED module among the plurality of OLED modules is overlapped with a portion of a second OLED module among the plurality of OLED modules that is positioned at a lateral side of the first OLED module.

16. A lamp assembly for a vehicle, comprising:
a housing that defines a space;
an outer lens that covers the space defined by the housing;
a bezel disposed on the space defined by the housing;
a plurality of OLED modules mounted on the bezel that is disposed on the space defined by the housing, the plurality of OLED modules mounted to be separated from each other;
a drive module configured to control the plurality of OLED modules; and
a connecting flexible circuit board disposed on at least one of the housing or the bezel, to which each of the plurality of OLED modules is connected and which is connected to the drive module,
wherein the housing comprises:
a dehumidifying bag housing portion on which a dehumidifying bag housing space is formed, the dehumidifying bag housing portion configured to house a dehumidifying bag, and
wherein the dehumidifying bag housing portion defines a first through-hole and a second through-hole, the first through-hole configured to pass air therethrough, and the second through-hole configured to pass a cable therethrough that connects to at least one processor.

17. The lamp assembly for a vehicle according to claim 1, wherein the holder comprises a shielding portion that conceals a portion of the module flexible circuit board.

18. The lamp assembly for a vehicle according to claim 17, wherein the each OLED module of the plurality of OLED modules further comprises an adhesive material configured to couple the OLED of the OLED module to the holder, and wherein the adhesive material is arranged between the OLED and the holder.

* * * * *